(12) United States Patent
Lee et al.

(10) Patent No.: US 6,232,651 B1
(45) Date of Patent: May 15, 2001

(54) LEAD FRAME FOR SEMICONDUCTOR DEVICE

(75) Inventors: Kyu-han Lee; Se-chul Park, both of Changwon (KR)

(73) Assignee: Samsung Aerospace Industries, Ltd., Kyungsangnam-do (KR)

( * ) Notice: Subject to any disclaimer, the term of this patent is extended or adjusted under 35 U.S.C. 154(b) by 0 days.

(21) Appl. No.: 09/316,138

(22) Filed: May 21, 1999

(51) Int. Cl.[7] .................................................. H01L 23/48
(52) U.S. Cl. ........................................... 257/666; 257/736
(58) Field of Search ........................... 428/676; 257/666, 257/678, 736, 734, 762, 781; 427/125

(56) References Cited

U.S. PATENT DOCUMENTS

| 4,068,022 | * | 1/1978 | Glick | 427/125 |
| 5,360,991 | | 11/1994 | Abys et al. | 257/666 |
| 5,436,082 | | 7/1995 | Mathew | 428/670 |

* cited by examiner

*Primary Examiner*—Don Wong
*Assistant Examiner*—James Clinger
(74) *Attorney, Agent, or Firm*—Finnegan, Henderson, Farabow, Garrett, & Dunner, L.L.P.

(57) ABSTRACT

A lead frame for semiconductor devices including a metal substrate having inner leads and outer leads, a nickel thin layer formed on the metal substrate, an outer layer formed of palladium or a palladium alloy on the nickel thin layer, and a protection layer formed of gold or platinum between the nickel thin layer and the outer layer.

6 Claims, 4 Drawing Sheets

LEAD FRAME FOR SEMICONDUCTOR DEVICE

BACKGROUND OF THE INVENTION

1. Field of the Invention

The present invention relates to a lead frame for semiconductor devices, and more particularly, to a lead frame in which a protection layer for protecting a nickel thin film layer deposited on the upper surface of a metal substrate is improved in applying a preplating method.

2. Description of the Related Art

Like semiconductor chips, a lead frame is essential to a semiconductor package, and supports a semiconductor chip and electrically connects the chip to an external circuit.

FIG. 1 shows an example of such a lead frame. As shown in FIG. 1, a lead frame 10 is comprised of a pad 11, inner leads 12, and outer leads 13. This lead frame can be usually manufactured by stamping or etching.

As shown in FIG. 2, a semiconductor chip 40 is installed on the pad 11, and wire-bonded to the inner leads 12. The outer leads 13 are electrically connected to an external circuit. Then, the chip 40 and the inner leads 12 are molded by resin 14 to complete a semiconductor package 15.

During the manufacture of the semiconductor package, the pad 11 and the ends of the inner leads 12 to be wire-bonded to the chip 40 are plated with a metal such as silver in order to provide a good wire bond property between the chip 40 and the inner leads 12 and good characteristics of the pad 11. Also, a predetermined area of the outer leads 13 is soldered, i.e., plated with tin-lead (Sn—Pb) to improve solderability for mounting the semiconductor package on a substrate. However, such a process requires a wet process after the resin molding process, which degrades the reliability of completed products.

In order to solve the above problem, a preplating method has been proposed for pre-coating a solder-wettable material on a lead frame and forming an intermediate plated layer before a semiconductor packaging process.

FIGS. 3 and 4 show examples of a conventional lead frame manufactured by the preplating method. As shown in FIG. 3, a nickel thin intermediate layer 22 and an outermost palladium thin layer 23 are sequentially stacked on a metal substrate 21 made of copper or a copper alloy. As shown in FIG. 4, a thin layer 24 made of gold is formed on the upper surface of the palladium thin layer 23.

In a lead frame 20 of FIG. 4 configured as described above, the nickel thin layer 22 prevents copper or iron in the metal substrate 21 from diffusing to the surface of the lead frame, to thereby form copper oxides or copper sulfides. The palladium thin layer 23 prevents oxidation of the surface of the nickel thin layer 22, and the gold thin layer 24 formed on the upper surface of the palladium thin layer 23 improves solderability.

However, during the manufacture of the lead frame 20, when there is damage to the surface of the metal substrate 21, a nickel layer on the damaged portion is more rapidly plated than on other neighboring portions due to a high surface energy of the damaged portion, which degrades cohesiveness of the damaged portion to the neighboring portion. In particular, in case that the surface of the nickel thin layer formed on the damaged portion is electrically plated with the palladium thin layer, a large amount of hydrogen is entrained during deposition of palladium because of the similarity between a palladium precipitation potential and a hydrogen precipitation potential, whereby damage to the palladium thin layer is accelerated. The damage to the palladium thin layer causes oxidation of the nickel layer to thus degrade solderability. Also, solderability can be degraded due to diffusion of components between plated layers caused by heat applied during a semiconductor manufacturing process.

A lead frame provided to solve the above problem has been disclosed in U.S. Pat. No. 5,360,991, in which a nickel thin layer is formed on the upper surface of a base metal, and a composite protection layer is formed on the upper surface of the nickel thin layer. The composite protection layer is comprised of a palladium or soft gold strike layer, a palladium-nickel alloy layer, a palladium layer, and a gold layer which are sequentially stacked on the nickel thin layer.

An example of another lead frame has been disclosed in U.S. Pat. No. 5,436,082, in which a nickel layer, a copper layer, a silver layer, and a palladium layer are sequentially stacked on the upper surface of a base metal.

The protection layer of each of the above-described conventional lead frames is comprised of a plurality of layers, resulting in a complicated manufacturing process and involving thermal migration from the protection layer to the outermost layer.

In an example of still another conventional lead frame, a gold thin layer can be formed on part of the external leads to protect the outermost palladium layer. In this case, the gold thin layer protects the palladium thin layer and also can reduce a wetting time by expediting smooth dissolution of palladium and lead upon initial wetting. However, use of a gold thin layer increases production costs and provides bad adhesiveness to molding resin, thus degrading the reliability of the semiconductor package. Also, there is a limit in making up for large and small cracks formed on a metal substrate during banding of the lead frame, and these cracks accelerate corrosion and oxidation of the lead frame. Furthermore, the gold thin layer forms Au—Sn together with tin (Sn) of a solder, thereby degrading solderability for mounting a semiconductor package on a substrate.

SUMMARY OF THE INVENTION

To solve the above problems, it is an objective of the present invention to provide a lead frame for semiconductor devices by which corrosion resistance, solderability, and productivity can be improved.

Accordingly, to achieve the above objective, there is provided a lead frame for semiconductor devices comprising: a metal substrate having inner leads and outer leads; a nickel thin layer formed on the metal substrate; an outer layer formed of palladium or a palladium alloy on the nickel thin layer; and a protection layer formed of gold or platinum between the nickel thin layer and the outer layer.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENT

Figure 1:
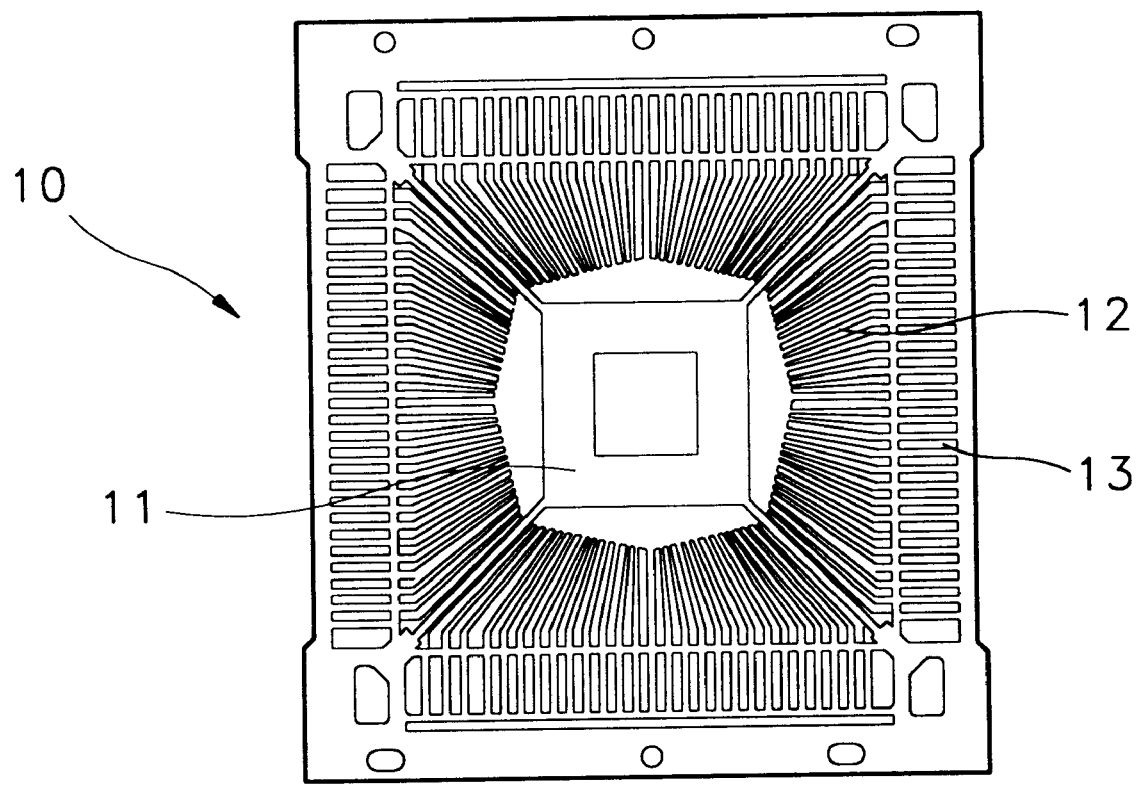
FIG. 1 is a schematic plan view of a conventional lead frame for semiconductor devices.
Figure 2:
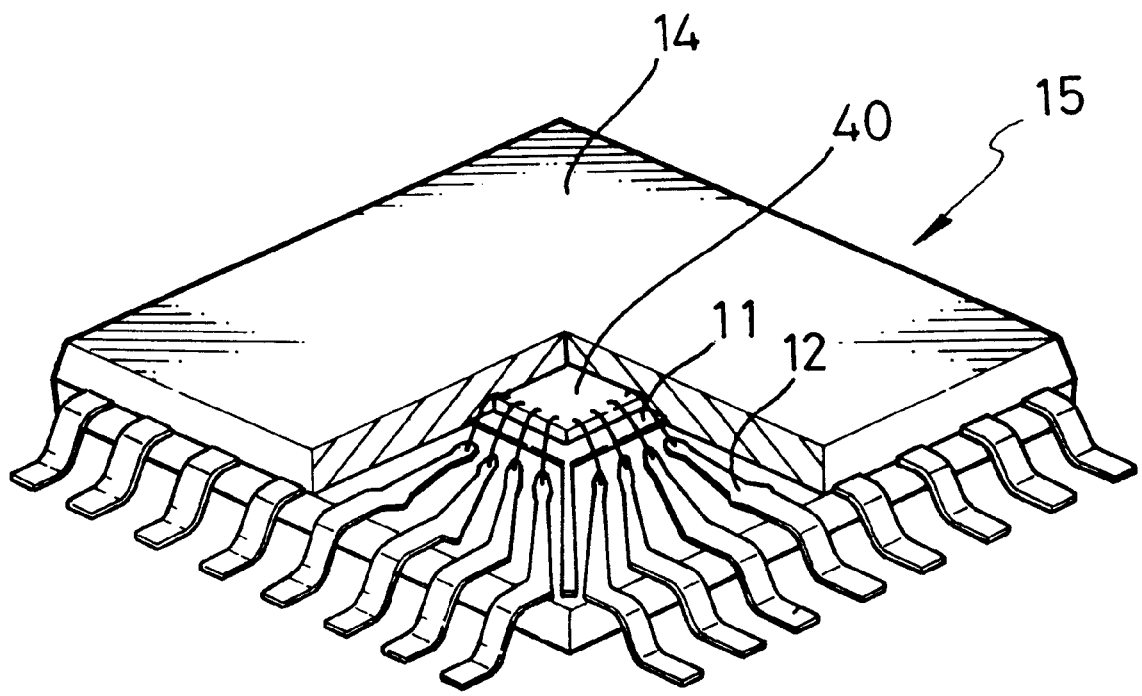
FIG. 2 is a partially-open perspective view of a semiconductor package adopting a conventional lead frame.
Figure 3:
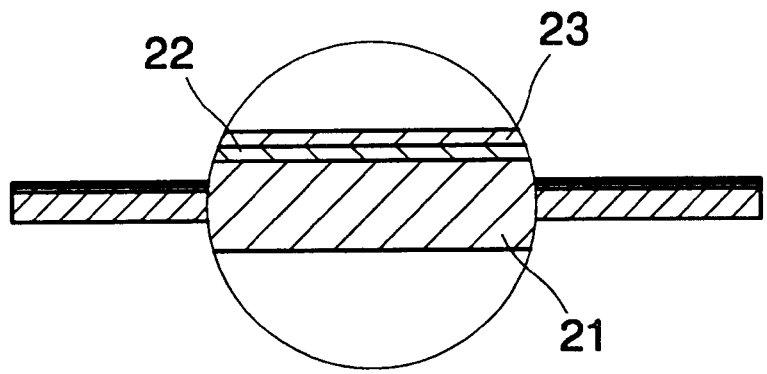
FIGS. 3 and 4 are cross-sectional views of conventional lead frames.
Figure 4:
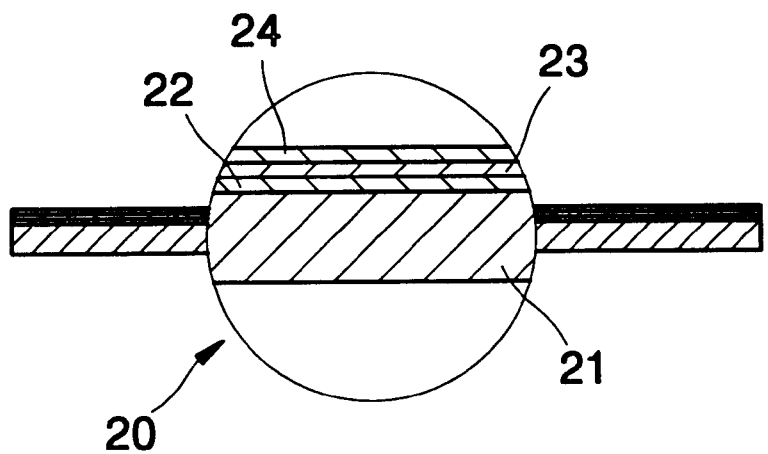
Figure 5:
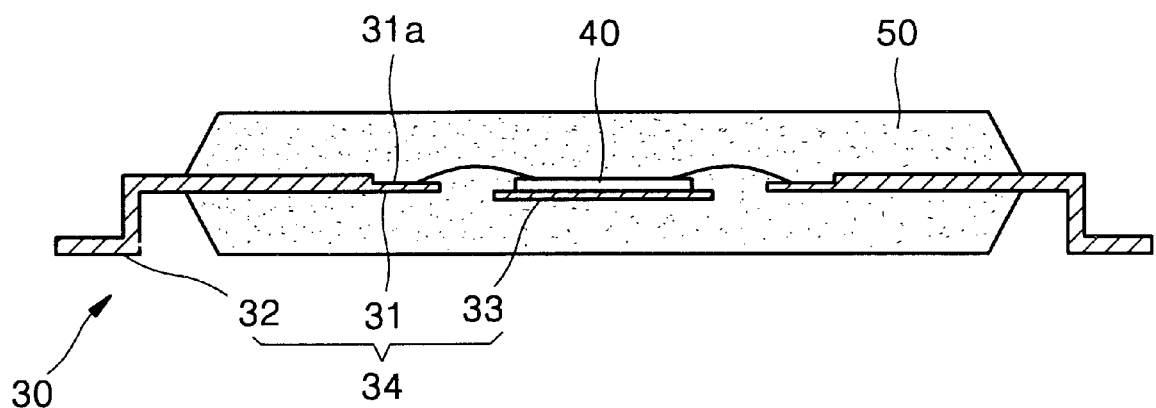
FIG. 5 is a cross-sectional view of a semiconductor package adopting a lead frame according to the present invention.

A semiconductor package 30 adopting a lead frame according to the present invention is shown in FIG. 5. Here, a lead frame 34 includes a plurality of inner leads 31 each having a coined portion 31a formed on the end thereof, a plurality of outer leads 32 which extend from the inner leads 31 and are electrically connected to an external circuit, and a pad 33 which is adjacent to the inner leads 31 and supported by a tie bar (not shown). A chip 40 is installed on the pad 33, and wire-bonded to the coined portions 31a of the inner leads 31. The chip 40 and the inner leads 31 are molded by a molding element 50.

Figure 6:
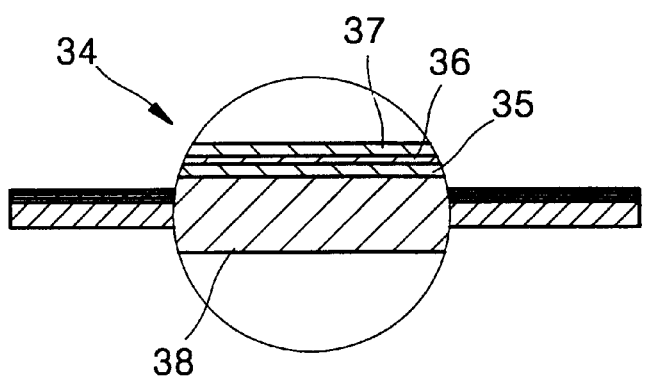
FIG. 6 is a cross-sectional view of a lead frame according to the present invention.

The lead frame 34 is formed of copper, a copper alloy, or an iron-nickel-family alloy, and, as shown in FIG. 6, includes a nickel thin layer 35 formed of nickel or a nickel alloy on the surface of at least one side of a metal substrate 38, a protection layer 36 formed on the upper surface of the nickel thin layer 35 for protecting the nickel thin layer 35, and an outer layer 37 formed on the protection layer 36.

The protection layer 36 is preferably formed of gold (Au), but can be formed of a material for protecting the nickel thin layer 35, e.g., platinum or a platinum alloy.

The thickness of the protection layer 36 is between 0.05 microinches and 0.5 microinches, preferably, 0.1 microinches. If the thickness of the protection layer 26 is less than 0.05 microinches, the component of the protection layer 36 spreads to the nickel thin layer 35 and the outer layer 37 by heat applied during a semiconductor manufacturing process. This degrades the effects of improvement of bondability and prevention of nickel diffusion. If the thickness of the protection layer 26 is greater than 0.5 microinches, diffusion of nickel is prevented, and bondability is improved, while production costs increase.

The outer layer 37 is formed of palladium or a palladium alloy to a thickness of 0.2 to 2 microinches, preferably, 1.0 microinches.

Preferably, the outer layer 37 is not formed on the pad 33 and the coined portion 31a because Ag epoxy resin used to mount the chip 40 on the pad 33 has a stronger affinity to gold than to palladium, and because a gold wire used during wire bonding also adheres to gold stronger than to palladium. However, wire bondability is not degraded even though the outer layer 37 is formed on the coined portion 31a, since gold in the protection layer 36 spreads to the outer layer 37 by heat applied during a semiconductor manufacturing process.

During the manufacture of a semiconductor package using the lead frame according to the present invention, diffusion of nickel in the nickel thin layer 35 to the outer layer due to heat can be blocked by the protection layer 36, so that oxidation or corrosion of the lead frame is prevented. The nickel thin layer prevents uneven distribution of internal energies due to residual stress. Since the palladium thin layer has a lower electronegativity than the gold protection layer, it protects the protection layer by acting as a sacrificial electrode when there is damage to the palladium thin layer or a crack is generated on the palladium thin layer, thereby preventing oxidation or corrosion of the nickel thin layer. Accordingly, when the semiconductor package is mounted on a circuit substrate, the adhesiveness between the nickel and lead of the outer leads can be increased.

Since the palladium thin layer is formed on the upper surface of the gold protection layer, outflow of a molding resin during molding as in the prior art can be prevented by the affinity between gold and the molding resin. Also, since the gold in the protection layer diffuses to the outer palladium layer due to heat applied during a semiconductor manufacturing process, bondability with respect to the gold wire is improved.

The effects of the lead frame according to the present invention can be understood more clearly by the following Experiments.

[Experiment 1]

In this experiment, the bondability of a first comparative example is compared with that of a first sample of the present invention. In the first comparative example, a nickel thin layer is formed to a thickness of 30 microinches on a metal substrate, and an outer layer is formed of palladium or a palladium alloy to a thickness of 0.5 microinches on the upper surface of the nickel thin layer. In the first sample of the present invention, a nickel thin layer is formed to a thickness of 30 microinches on a metal substrate, a gold protection layer is formed to a thickness of 0.1 microinches on the upper surface of the nickel thin layer, and an outer layer is formed to a thickness of 0.5 microinches on the upper surface of the protection layer.

The diameter of a gold wire used for bonding is 0.1 mm, the preheating temperature and the bonding temperature are respectively 185° C. and 228° C., the bonding power and bonding force of a chip portion are respectively 75 mW and 40 mN, and the bonding power and bonding force of an inner lead portion are respectively 140 mW and 130 mN. The bonding time of the chip portion and that of the inner lead portion are respectively 15 msec and 20 msec.

The rupture strength of a wire bonded under the above-described conditions is shown in the following Table 1, which is measured by pulling the bonded wire at the middle place of a bonded portion of the inner leads and the chip of the lead frame.

As can be seen from the following Table 1, the wire bondability of the first sample of the present invention is significantly greater than that of the comparative example.

TABLE 1

|  | first comparative example | first sample of the present invention |
| --- | --- | --- |
| minimum rupture strength of wire (g) | 1.50 | 4.50 |
| average rupture strength of wire (g) | 4.65 | 7.44 |
| maximum rupture strength of wire (g) | 7.00 | 9.30 |

[Experiment 2]

In this experiment, the bondability of a second comparative example is compared with that of a second sample of the present invention. In the second comparative example, a nickel thin layer is formed to a thickness of 30 microinches on a metal substrate, and an outer layer is formed of palladium or a palladium alloy to a thickness of 0.8 microinches on the upper surface of the nickel thin layer. In the second sample of the present invention, a nickel thin layer is formed to a thickness of 30 microinches on a metal substrate, a gold protection layer is formed to a thickness of 0.1 microinches on the upper surface of the nickel thin layer, and outer layers are formed to thicknesses of 0.1, 0.5, 1.0, and 2.0 microinches on the upper surface of the gold protection layer.

The diameter of a gold wire used for bonding is 0.1 mm, the bonding temperature is 215° C., the bonding power and bonding force of a chip portion are respectively 90 mW and 90 mN, and the bonding power and bonding force of an inner lead portion are respectively 100 mW and 100 mN. The bonding time of the chip portion and that of the inner lead portion are respectively 15 msec and 20 msec.

The rupture strength of a gold wire bonded to the inner lead portion under the above-described conditions is shown in the following Table 2, which is measured by pulling the bonded gold wire.

It becomes evident from the following Table 2 that the wire bondability of each of the samples of the present invention is improved by 10% or more compared to that of the comparative example. In particular, it can be seen from the samples of the present invention that at least 90% up to a maximum of 97% of a bonded surface area is lead-covered, and solderability is increased.

TABLE 2

|  | second comparative example | second samples of the present invention | | | |
| --- | --- | --- | --- | --- | --- |
| thickness of outer layer (MIN $\mu"$) | 0.8 | 0.1 | 0.5 | 1.0 | 2.0 |
| thickness of protective layer (MIN $\mu"$) |  | 0.1 | 0.1 | 0.1 | 0.1 |
| thickness of nickel thin layer (MIN $\mu"$) | 30 | 30 | 30 | 30 | 30 |
| minimum rupture strength of wire (g) | 4.61 | 1.93 | 5.45 | 5.32 | 5.09 |
| maximum rupture strength of wire (g) | 8.2 | 7.93 | 9.40 | 8.58 | 8.94 |
| average rupture strength of wire (g) | 6.71 | 5.76 | 7.09 | 7.06 | 6.96 |
| rate of lead-covered area with respect to bonded surface area (%) | 70 | 70 | 95 | 97 | 90 |

[Experiment 3]

In this experiment, the bondability of a third comparative example is compared with that of a third sample of the present invention. In the third comparative example, a nickel thin layer is formed to a thickness of 30 microinches on a metal substrate, and an outer layer is formed of palladium or a palladium alloy to a thickness of 0.5 microinches on the upper surface of the nickel thin layer. In the third sample of the present invention, a 30-microinch nickel thin layer is formed on a metal substrate, a 0.1-microinch gold protection layer is formed on the upper surface of the nickel thin layer, and an 0.5-microinch outer layer is formed on the upper surface of the gold protection layer.

The diameter of a gold wire used for bonding is 0.2 mm, the bonding temperature is 225° C., the bonding power and bonding force of a chip portion are respectively 60 mW and 60 mN, and the bonding power and bonding force of an inner lead portion are respectively 105 mW and 110 mN. The bonding time of the chip portion and that of the inner lead portion are respectively 20 msec and 16 msec.

The rupture strength of a gold wire bonded under the above-described conditions is shown in the following Table 3, which is measured by pulling the bonded gold wire.

TABLE 3

|  | third comparative example | | | third sample of the present invention | | |
| --- | --- | --- | --- | --- | --- | --- |
| thickness of outer layer (MIN $\mu"$) | 0.5 | | | 0.5 | | |
| thickness of protection layer (MIN $\mu"$) |  | | | 0.1 | | |
| thickness of nickel thin layer (MIN $\mu"$) | 30 | | | 30 | | |
| positions at which gold wire is pulled | center | ball | stitch | center | ball | stitch |
| minimum rupture strength of wire (g) | 10.12 | 9.72 | 7.23 | 10.40 | 11.01 | 10.81 |
| maximum rupture strength of wire (g) | 13.30 | 13.18 | 13.78 | 17.40 | 14.54 | 19.29 |
| average rupture strength of wire (g) | 11.77 | 11.43 | 10.47 | 13.41 | 12.40 | 15.02 |
| rate of lead-covered area with respect to bonded surface area (%) | 70 | | | 90 through 97 | | |

It can be seen from the above Table 3 that the wire bondabilities of the third sample of the present invention are superior to those of the comparative example regardless of the pulling positions. Also, the third sample of the present invention can increase solderability since at least 90% of a bonded surface area is lead-covered.

What is claimed is:

1. A lead frame for semiconductor devices comprising:

a metal substrate having inner leads and outer leads;

a nickel thin layer formed on the metal substrate;

an outer layer formed of palladium or a palladium alloy on the nickel thin layer; and a protection layer formed of gold or platinum between the nickel thin layer and the outer layer.

2. The lead frame for semiconductor devices as claimed in claim 1, wherein the thickness of the protection layer is 0.05 to 0.5 microinches.

3. The lead frame for semiconductor devices as claimed in claim 2, wherein the thickness of the protection layer is 0.1 microinches.

4. The lead frame for semiconductor devices as claimed in claim 1, wherein the thickness of the outer layer is 0.2 to 2 microinches.

5. The lead frame for semiconductor devices as claimed in claim 4, wherein the thickness of the protection layer is 0.1 microinches.

6. The lead frame for semiconductor devices as claimed in claim 1, wherein the palladium plated layer is not formed on the end of each of the inner leads.

* * * * *

UNITED STATES PATENT AND TRADEMARK OFFICE
CERTIFICATE OF CORRECTION

PATENT NO. : 6,232,651 B1
DATED : May 15, 2001
INVENTOR(S) : Kyu-han Lee et al.

Page 1 of 1

It is certified that error appears in the above-identified patent and that said Letters Patent is hereby corrected as shown below:

Column 6, claim 6,
Line 55, after "palladium", delete "plated"; and
Line 56, "the end" should read -- an end --.

Signed and Sealed this

Thirteenth Day of November, 2001

Attest:

*Attesting Officer*

NICHOLAS P. GODICI
*Acting Director of the United States Patent and Trademark Office*